(12) United States Patent
Amidi

(10) Patent No.: US 12,174,717 B2
(45) Date of Patent: *Dec. 24, 2024

(54) APPARATUS, SYSTEMS, AND METHODS FOR DYNAMICALLY RECONFIGURED SEMICONDUCTOR TESTER FOR VOLATILE AND NON-VOLATILE MEMORIES

(71) Applicant: Intelligent Memory Limited, Kwai Chung (HK)

(72) Inventor: Mike Hossein Amidi, Lake Forest, CA (US)

(73) Assignee: Intelligent Memory Limited, Kwai Chung (HK)

( * ) Notice: Subject to any disclaimer, the term of this patent is extended or adjusted under 35 U.S.C. 154(b) by 0 days.

This patent is subject to a terminal disclaimer.

(21) Appl. No.: 18/385,886

(22) Filed: Oct. 31, 2023

(65) Prior Publication Data

US 2024/0193058 A1 Jun. 13, 2024

Related U.S. Application Data

(62) Division of application No. 17/985,037, filed on Nov. 10, 2022.

(51) Int. Cl.
*G06F 11/27* (2006.01)
*G11C 29/56* (2006.01)

(52) U.S. Cl.
CPC .............. *G06F 11/27* (2013.01); *G11C 29/56* (2013.01); *G11C 29/56004* (2013.01);
(Continued)

(58) Field of Classification Search
None
See application file for complete search history.

(56) References Cited

U.S. PATENT DOCUMENTS 6,320,812 B1 11/2001 Cook, III et al.
6,941,232 B2 9/2005 Burke, Jr. et al.
(Continued)

FOREIGN PATENT DOCUMENTS

CN 103390432 B 4/2017
CN 105183595 B 10/2018
(Continued)

OTHER PUBLICATIONS

SPGA Chips Boast Hihg SPeed and Embedded Core, edn.com, Nov. 7, 1996, 2 pages.
(Continued)

*Primary Examiner* — Guerrier Merant
(74) *Attorney, Agent, or Firm* — Fish IP Law, LLP

(57) ABSTRACT

A memory testing device uses a master control unit to concurrently operate multiple, intelligent, slave control units (SCUs). SCUs have one or more processing unit(s) (i.e. Finite State Machines, micro controllers, processors) capable of processing one or more firmware with or without operating system (i.e. bare-metal, embedded OS, RTOS (real time operating system)) to perform a series of task defined by firmware(s) for testing volatile and/or non-volatile memory devices connected into one or more DUT devices plus SCU has capability of having operating system and install and run host applications locally within each SCU units to mimic host applications environments along with performing regular memory testing.

20 Claims, 5 Drawing Sheets

Current Invention Tester Architecture

(52) U.S. Cl.
CPC .. *G11C 29/56012* (2013.01); *G11C 29/56016* (2013.01); *G11C 2029/5602* (2013.01)

(56) References Cited

U.S. PATENT DOCUMENTS

| | | |
|---|---|---|
| 7,707,468 B2 | 4/2010 | Volkerink et al. |
| 9,570,199 B2 | 2/2017 | Chinnakkonda Vidyapoornachary et al. |
| 9,817,062 B2 | 10/2017 | Roberts, Jr. |
| 2004/0181731 A1 | 9/2004 | Rajsuman et al. |
| 2012/0072788 A1 | 3/2012 | Chen et al. |
| 2014/0173345 A1 | 6/2014 | Gorti et al. |
| 2017/0115351 A1 | 4/2017 | Datla Jagannadha et al. |
| 2018/0336111 A1 | 11/2018 | Gendler et al. |

FOREIGN PATENT DOCUMENTS

| | | | |
|---|---|---|---|
| CN | 109545264 A | 3/2019 | |
| CN | 110161400 B | 9/2020 | |
| CN | 212484339 U | 2/2021 | |
| EP | 4020758 A1 | 6/2022 | |
| EP | 1858028 | 12/2022 | |
| KR | 20230009628 A * | 1/2023 | |
| WO | WO-2017075622 A1 * | 5/2017 | ............. G11C 29/12 |

OTHER PUBLICATIONS

Final Rejection for related U.S. Appl. No. 17/985,037, dated May 1, 2024, 34 pages.

* cited by examiner

Prior Art Volatile Memory Device Tester

Prior Art Non-volatile Memory Device Tester

Prior Art Volatile Memory DIMM Tester

Prior Art Non-volatile Memory Module Tester

Current Invention Tester Architecture

APPARATUS, SYSTEMS, AND METHODS FOR DYNAMICALLY RECONFIGURED SEMICONDUCTOR TESTER FOR VOLATILE AND NON-VOLATILE MEMORIES

PRIORITY

This application is a divisional of U.S. patent application Ser. No. 17/985,037 filed Nov. 10, 2022.

BACKGROUND

Computer systems utilize both volatile and non-volatile memories to store and retrieve data. Volatile memories are advantageous because they achieve quicker access time compared to traditional hard drive (HDD) or Solid State Drives (SSD) devices. In general, the access time of volatile memories is at least one magnitude faster than traditional HDD or SSD devices. Volatile memories are generally used to store and retrieve data for shorter durations since they lose data when power is lost/removed.

Non-volatile memories are advantageous in that they retain data even after power is lost/removed. As such, non-volatile memories are generally used to store and retrieve data for longer durations, and to allow other computer systems to access the data.

Due to current on-going demand for higher access speeds, the majority of computer systems utilize a combination of volatile memories to temporarily store data, and non-volatile memories to store and retrieve data for longer periods of time, including for example seconds, minutes, hours, days, months, or even years.

Volatile and non-volatile memories are usually assembled from individual dies from semiconductor wafers fabricated by specific lithography processes. In general these wafers and their dies are tested for proper electrical operational and functionality based on a given specification for their voltages (DC levels) and timing (AC level) parameters. Once one or more good known dies are identified within a wafer, then these dies will be taken through a packaging process so that a final product can be built using individual volatile and non-volatile memories device packages.

Both volatile and non-volatile memories can be packaged and assembled using single dies, and also dual, quad, and octal dies, and beyond. In some instances, the packages include monolithic or multiple dies arranged in sub-systems.

Manufacturers and suppliers want both volatile and or non-volatile memories to be reliable, robust, and operational for the life of the product. To help insure those qualities, memory components are often subjected to rigorous testing. Given the complexity of volatile and non-volatile packages, one can imagine the importance of robust testing for building sub-systems and final, fully-assembled systems.

Many companies provide generic semiconductor testing equipment, which is then customized to test voltage, frequency, and temperate for specific memories, using application-specific integrated circuits (ASICs) or Field programmable Gate Arrays (FPGAs).

In general, such generic testers are limited to testing either volatile memories or non-volatile memories, but not both. Generic testers are also limited in that they are only capable of implementing fixed functional test patterns against existing industry standards, using Automatic Test Pattern Generation (ATPG) patterns. Taken together, these limitations are problematic in that memories are not tested in end-user products running end-user software. Nor can they replicate the circumstances in which a memory failure occurred in an end-user product. Accordingly, there is no way to use generic testers to effectively predict end-user needs, or fix many of the end-user problems.

U.S. Pat. No. 7,707,468 to Volkerink describes a testing device in which a memory controller manages a star arrangement in which each of multiple interface boards work in parallel to test multiple memory modules. The arrangement allows concurrent testing of the various memory modules at different operating rates, but the patent is silent with respect to concurrent testing of both volatile and or non-volatile memories. Moreover, the interface boards are not intelligent, so they cannot operate on multiple different testing patterns downloaded from the memory controller. There is also no teaching, suggestion, or motivation to test memory modules while they are running application software.

Therefore, there exists a demand for a semiconductor testing system (1) capable of testing both volatile and non-volatile memory devices, (2) with either one or multiple dies in a package, and (3) in a testing environment that closely mimics an end-user's host system (i.e. PC, laptop, server, cloud, etc.) and software. Ideally, such a system would provide detailed AC and DC level test coverage, along with functional tests under normal operating temperature, high and low temperature, high-nominal-low voltage levels, and high-nominal-low frequency of operation to fully stress, exercise, and perform real world functional tests at operating speed of the host system. A system as such should be capable of running end customer application on a local operating system (OS) capable of executing one or multiple application to mimic target host application environment.

SUMMARY OF THE INVENTION

The inventive subject matter described herein provides dynamic real-time testing for both volatile and non-volatile arrays of memories. In contemplated apparatus, systems, and methods, a memory tester unit is capable of reconfiguring (a) its Input and Output (I/O) pins Voltage levels, and (b) its operational frequencies dynamically, without any system reboot requirements, and performing different real-time testing patterns for different volatile families of products and/or different non-volatile families of products.

Contemplated memory tester units comprise several components as described hereinafter. A Master Controller Unit (MCU) manages one or more Slave Controller Unit (SCU) capable of testing both volatile and non-volatile memories. Each SCU is capable of conducting one or more different real-time test patterns running by application on one or more fully isolated memory channels of the same or different type of memories. By utilizing this modular approach the MCU can program one or more SCU in parallel to perform gang/parallel testing to one or more memory devices, which improves productivity and testing speed, and reduces total testing cost. A single operator can load the proper test pattern into one MCU, and the MCU can upload the test pattern into one or many SCUs, each operating with a required real-time test pattern, and with each SCU memory channel testing one or more memory devices, regardless of whether the individual memories being tested have monolithic, dual, quad, octal, or other number of dies.

As contemplated herein, an MCU can connect to each SCU via a traditional wired or wireless method to program and initialize the SCU unit. The MCU can advantageously use a smart, fully automated scanner method to automatically load the proper MCU program to load and execute each SCUs. This automation process is contemplated to further improve utilization, reduces human error, and improve overall test cost.

As noted above, each memory tester unit can have one or more MCU, where each MCU connects to one or more SCU, and each SCU can address one or more memory channels. It is also contemplated that each memory channel can have one or more Device Under Test boards (DUTs), where each of the DUTs has one or more sockets to test individual memory packages of either volatile and or non-volatile memories. As should be apparent to someone with expertise in this field upon understanding this application, one can use a single scanned program to test several hundred memory package at any given time.

MCUs can be connected to a Power Management Unit (PMU) configured to increase and decrease the input Voltage and Current to SCU I/O pins, Voltage rails of DUT memory sockets, and the rest of the circuit. This flexibility allows MCU to enable the same ecosystem to test different memory device packages that requires different operating voltage levels. (i.e. DRAM 5.0V, SDRAM 3.3V. DDR-I 2.5V, DDR-II 1.8V, DDR-III, 1.5V, DDR-IV 1.2V, etc.)

MCUs can also be connected to a Clock Management Unit (CMU) configured to provide a wide range of clock intervals for SCU core frequency operations, along with SCU I/O pins, and clock pins of DUT memory sockets. This capability allows SCU to support many different memory technologies requiring different operating frequencies. (i.e. SDRAM 100 Mhz, DDR-I 200 Mhz, DDR-II 400 Mhz, DDR-III 800 Mhz, and DDR-IV 1600 Mhz)

MCUs can also be configured to program on board Temperature Management Unit (TMU) chambers to provide nominal room temperature, low and high temperatures (i.e. −50 C to +155 C) to further stress a device under test for better sorting and separating good and marginal devices under the test.

MCUs can also be configured to vary Voltage, Frequency, and Temperature to perform solid 3 corner testing while applying customer memory testing patterns, and running DUT devices under real-time operations like target customer system.

MCUs can also be configured to as an off the shelf Personal Computer (PC), or embedded PC to perform its tasks. Software running an MCU can advantageously perform all the task management of controlling Voltage, Frequency, Temperature, along with SCUs. In some embodiments, an MCU can be a dedicated processing unit (PU) comprised of one or more microcontroller, microprocessor, or processor units, with or without an Operating System (OS) running one or more FW to collectively control SCU, PMU, CMU, and TMU units.

The SCU can be configured in many ways, including embodiment in which the SCU can use any combination of software running on a PC, hardware running on an ASIC, or dynamic hardware running on FPGA. An SCU can be configured to have solid analog and digital logics, Finite State Machine (FSM), one or more processing units (i.e. micro controller, microprocessor, processor, etc.) or a combination of one or more of these methods.

In some embodiments, SCUs 516, 521 are configured to run one or more FW, to manage one or more tasks on one or more channels of each SCU, which can be connected to one or more DUTs, and exercise one or more series of volatile and/or non-volatile memory test patterns to one or more sockets connected to each DUT units. Such a configuration collectively allows a SCU to completely perform parametric testing, functional testing, of each connected sockets to each connected DUT per each SCU channels.

In one embodiment according to the inventive subject matter, a SCU has DUT and sockets for testing volatile memory devices.

In another embodiment according to the inventive subject matter, a SCU has DUT and sockets for testing non-volatile Memory devices.

In another embodiment according to the inventive subject matter, a SCU has DUT and sockets for testing volatile DIMM devices.

In yet another embodiment according to the inventive subject matter, a SCU has DUT and sockets for testing Non-volatile Module devices.

Contemplated SCU processing units can run one or more microcontroller, microprocessor, or processors using any of stand-alone bare metal firmware (FW), mini operating system, full blow embedded operating system, or real-time operating system (RTOS). The FW running on SCU processing unit can be done as one or more series of programming code to provide effective and efficient execution of the intended functionality, either as a single FW program or as a modular approach. The FW can be done with low level programming languages such as assembly or machine code, or higher abstract level such as C (i.e. C, C++, C##, etc.) or object-oriented programming (OOP).

The inventive subject matter described herein is intended to address the entire ecosystem of dynamically programming a highly flexible tester unit to test semiconductor volatile and non-volatile memories, by loading one configuration into MCU to dynamically program and execute one or many SCU, PMU, CMU, and TMU. The contemplated apparatus, systems and methods create a fully flexible, dynamic, programmable semiconductor testing system to test both volatile and non-volatile memory of different generations, under different voltages, different frequencies, and different thermal swings to fully stress. Customized, full functional tests can be run with real-time applications, which enable users to detect any AC and DC level parameters across the entire ranges of acceptable voltages, temperatures, and frequencies, including errors that would be undetectable by standard off the shelf semiconductor testers.

Collectively, these features will help users reduce operational cost, reduce human error, improve yield, reduce system error, and improve system performance.

DETAIL DESCRIPTION OF INVENTION

Figure 1:
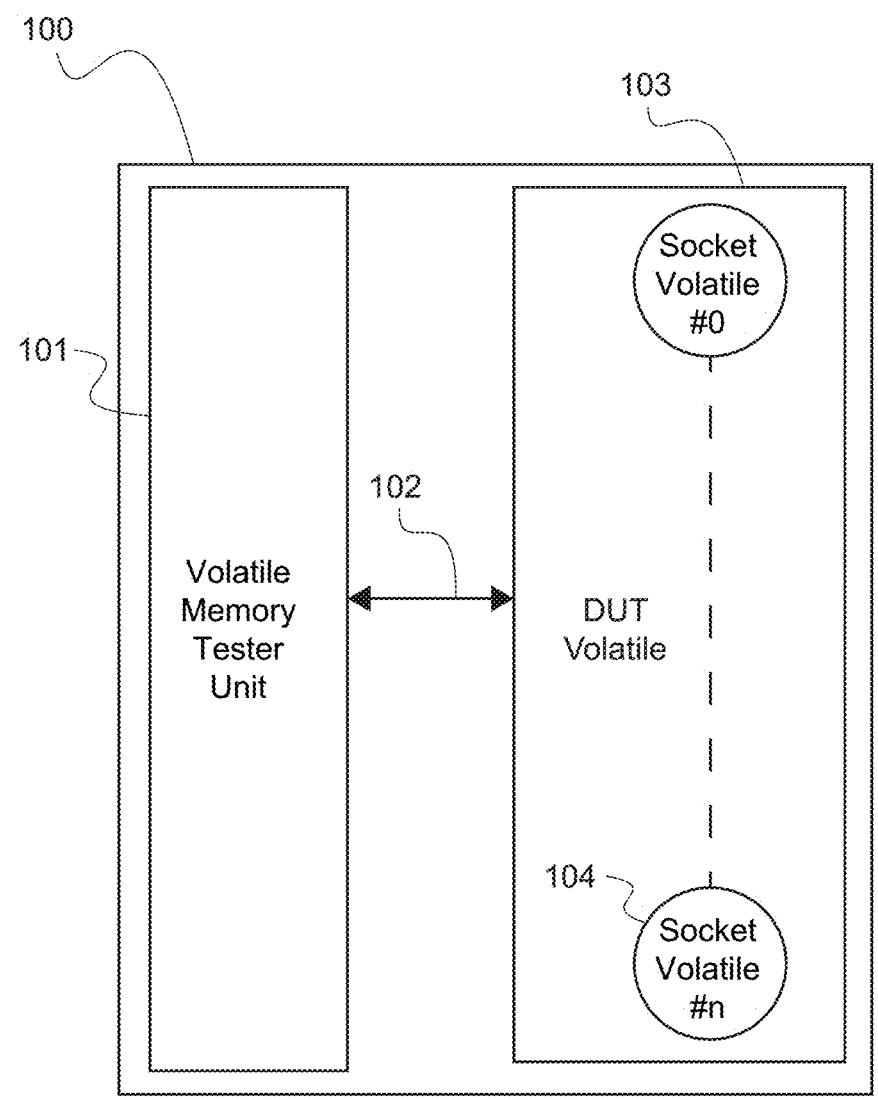
FIG. 1 is a diagram of a prior art volatile memory device tester.

FIG. 1 is a diagram of a prior art volatile memory device tester 100, which generally includes a volatile memory tester unit 101 connected to a Device Under Test (DUT) 103 via connection 102. DUT 103 comprises one or more sockets 104 #0-104 #n configured to communicate with volatile memory devices (not shown). Volatile memory device tester 100 allows an end user to perform standard off the shelf parametric testing on one or more volatile memory devices plugged into sockets 104 #0-104 #n, respectively.

Figure 2:
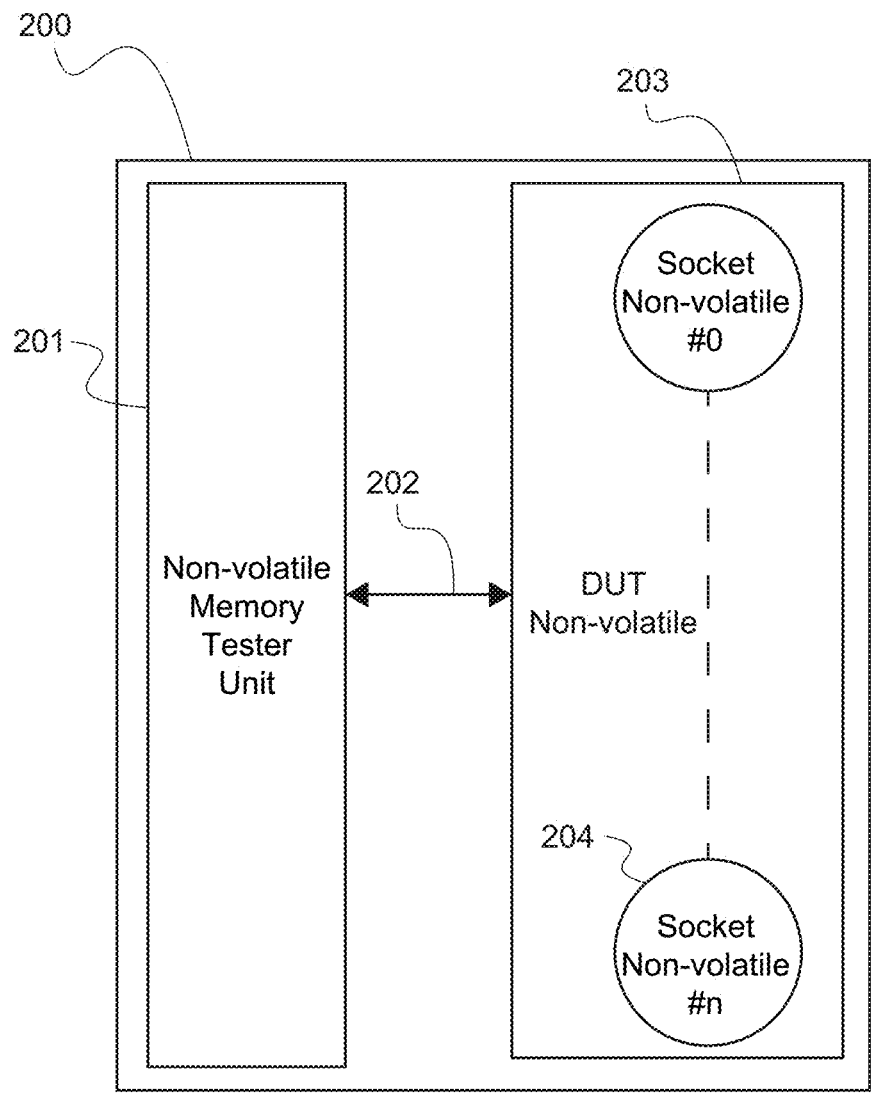
FIG. 2 is a diagram of a prior art non-volatile memory device tester.

FIG. 2 is a diagram of a prior art non-volatile memory device tester 200, which generally includes a volatile memory tester unit 201 connected to a Device Under Test (DUT) 203 via connection 202. DUT 203 comprises one or more sockets 204 #0-204 #n configured to communicate with non-volatile memory devices (not shown). Non-volatile memory device tester 200 allows an end user to perform standard off the shelf parametric testing on one or more non-volatile memory devices plugged into sockets 204 #0-204 #n, respectively.

Figure 3:
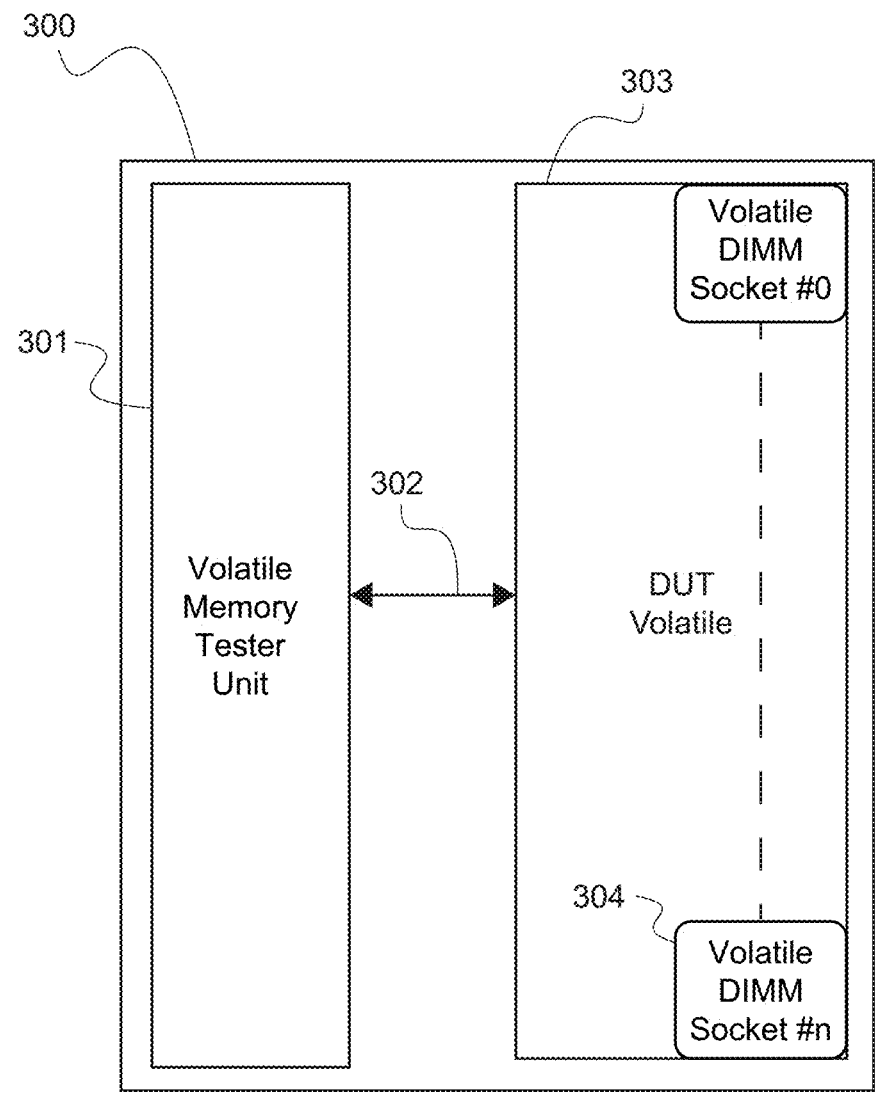
FIG. 3 is a diagram of a prior art volatile memory dimm tester.

FIG. 3 is a diagram of a prior art volatile memory dimm tester 300, which generally includes a volatile memory tester unit 301 connected to a Device Under Test (DUT) 303 via connection 302. DUT 303 comprises one or more dimm sockets 304 #0-304 #n configured to communicate with volatile memory dimm modules (not shown). Volatile memory dimm tester 300 allows an end user to perform standard off the shelf parametric testing on one or more volatile memory dimm modules plugged into dimm sockets 304 #0-304 #n, respectively.

Figure 4:
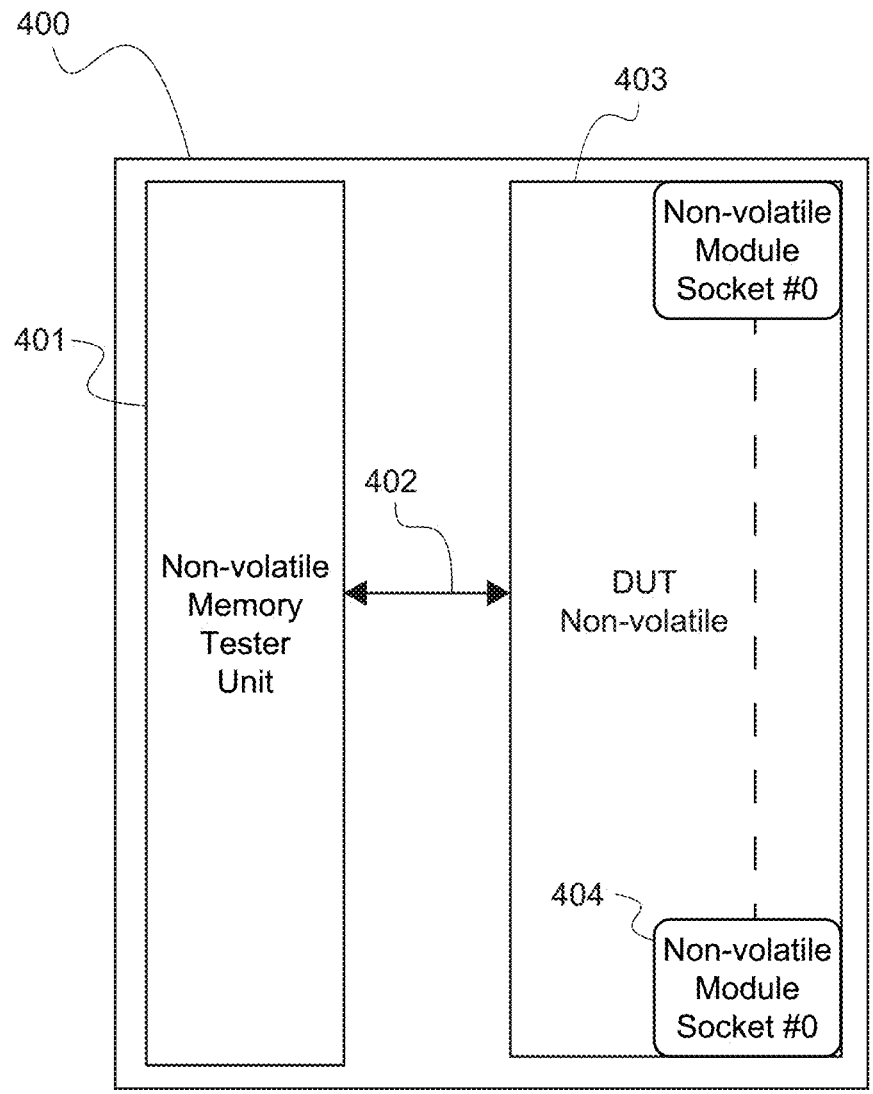
FIG. 4 is a diagram of a prior art non-volatile memory module tester.

FIG. 4 is a diagram of a prior art non-volatile memory module tester 400, which generally includes a volatile memory tester unit 401 connected to a Device Under Test (DUT) 403 via connection 402. DUT 403 comprises one or more module sockets 404 #0-404 #n configured to communicate with non-volatile memory modules (not shown). Non-volatile memory module tester 400 allows an end user to perform standard off the shelf parametric testing on one or more non-volatile memory devices plugged into module sockets 404 #0-404 #n, respectively.

Figure 5:
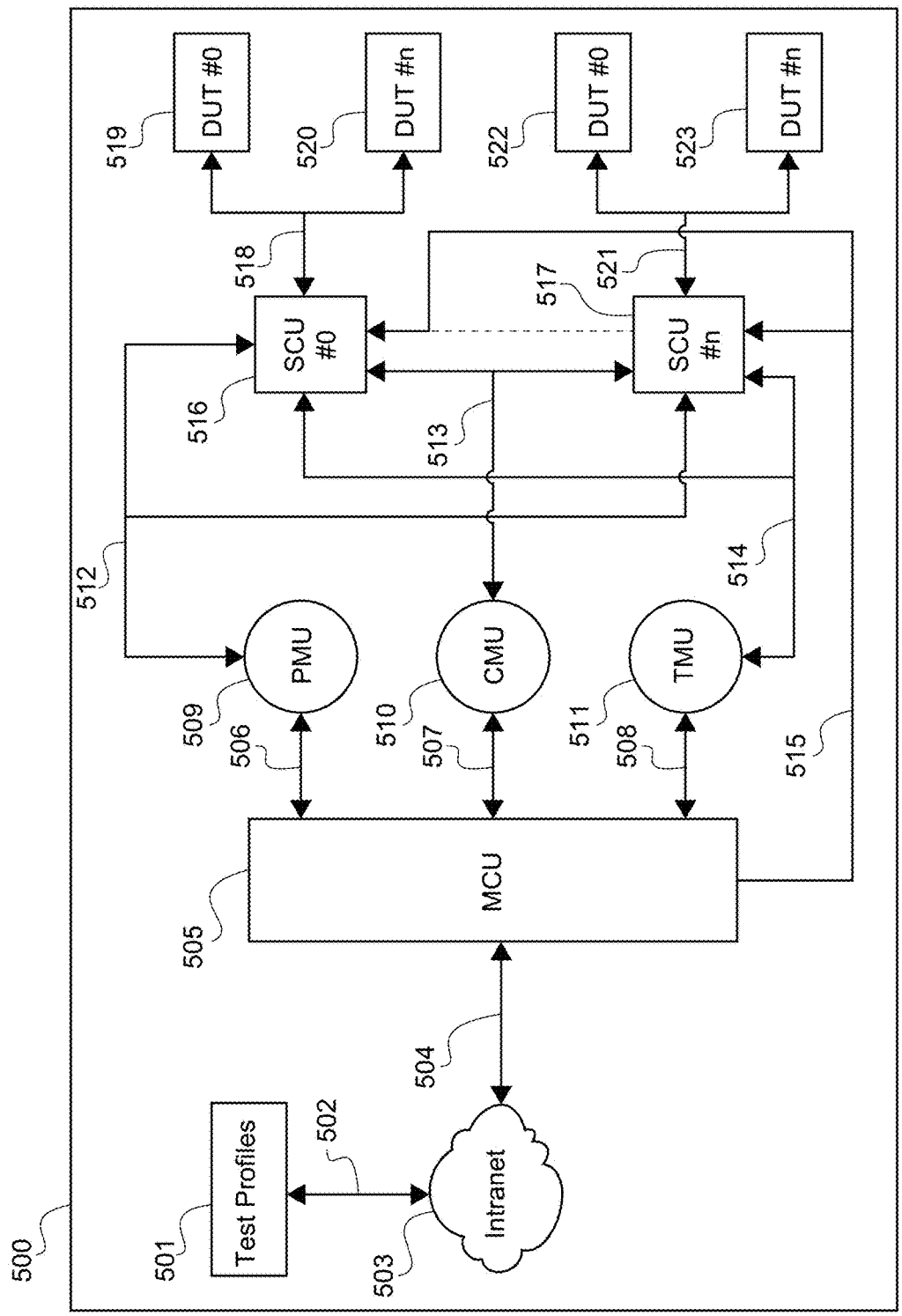
FIG. 5 is a schematic of a tester architecture of a device according to the inventive concepts herein.

FIG. 5 is a schematic of one embodiment of a tester architecture of a device 500 according to the inventive concepts herein. The device 500 is capable of testing both volatile and non-volatile memory device units, DIMMs, and module units. Device 500 generally comprises test profiles 501 of volatile and non-volatile memory testing patterns, a network 503, a MCU 505, PMU 509, CMU 510, and TMU 511, SCUs 516, 521, and multiple DUTs 519, 520, 522, 523.

Test profiles 501 communicate with the network 503 via communication line 502, which can be wired or wireless. The network can be any suitable network, including for example an intranet or extranet.

MCU 505 is configured to send a copy of any of the test profiles 501 to one or more of the SCUs 516, 521 via communication line 515. MCE 505 is connected to the PMUs 509, CMU 510, and TMU 511 by a communication bus (not shown) through communication lines 506, 507, and 508, respectively.

The MCU 505 is configured to individually program and change each of PMU 509, CMU 510, and TMU 511 individually, in series, or in parallel as it may require based on the test profiles 501. PMU 509 is connected to one or more SCUs 516, 521 via communication line 512. CMU 510 is connected to one or more SCUs 516, 521 via communication line 513. TMU 511 is connected to one or more SCUs 516, 521 via communication line 514. This architecture allows PMU, CMU, and TMU units to individually capable of programming and controlling one or more SCUs 516, 521 in parallel.

SCU 518 is connected to DUT 519 and DUT 520 in parallel, where SCU 516 is connected to one or more DUTs via communication bus 518. DUT 519 represents the first of n1 DUTs, and DUT 520 represents the last of n1 DUTs controlled by SCU 518.

SCU 521 is connected to DUT 522 and DUT 523 in parallel, where SCU 521 is connected to one or more DUTs via communication bus 521. DUT 522 represents the first of n2 DUTs, and DUT 523 represents the last of n2 DUT board controlled by SCE 522. The current invention architecture should be interpreted to facilitate a high degree of parallelism due to the many dedicated internal busses between connections.

Communication lines 515 and 517 provide facilitate additional communications as shown.

In a simple example dealing with volatile memories, MCU 505 applies only a single one of the test profiles 501 via network 503 to one or more SCUs 516, 521, and performs all required test using nominal PMU, CMU, and TMU settings, where the SCUs 516, 521 would apply required AC and DC level signals and test patterns to all the DUTs 519, 520, 522, 523, and each of DUTs 519, 520, 522, 523 performs the required tasks. The test results, with individual memory address locations for each memory die section, and data error log, can be recorded in the corresponding SCUs, and the aggregated logs can be provided to the MCU 505, and stored in the network 503 for further analysis. In this example the MCU 505 could program and test all sockets to test one type of volatile memory at nominal levels. In another example the same program could program and test the same volatile memory sockets, but with voltage variation using PMU 509, or clock frequency variation using CMU 510, or temperature variation using TMU 511. or a combination of one or more variations of PMU 509, CMU 510, and TMU 511 to test the same volatile memory sockets with multiple corner testing.

In another embodiment dealing with non-volatile memories, MCU 505 applies only a single one of the test profiles 501 via network 503 to one or more SCUs 516, 521, and performs all required test using nominal PMU, CMU, and TMU settings, where the SCUs 516, 521 would apply required AC and DC level signals and test patterns to all the DUTs 519, 520, 522, 523, and each of DUTs 519, 520, 522, 523 performs the required tasks. The test results, with individual memory address locations for each memory die section, and data error log, can be recorded in the corresponding SCUs, and the aggregated logs can be provided to the MCU 505, and stored in the network 503 for further analysis. In this example the MCU 505 could program and test all sockets to test one type of non-volatile memory at nominal levels. In another example the same program could program and test the same non-volatile memory sockets, but with voltage variation using PMU 509, or clock frequency variation using CMU 510, or temperature variation using TMU 511. or a combination of one or more variations of PMU 509, CMU 510, and TMU 511 to test the same volatile memory sockets with multiple corner testing.

In another embodiment dealing with both volatile and non-volatile memories, MCU 505 applies only a single one of the test profiles 501 via network 503 to one or more SCUs 516, 521, and performs all required test using nominal PMU, CMU, and TMU settings, where the SCUs 516, 521 would apply required AC and DC level signals and test patterns to all the DUTs 519, 520, 522, 523, and each of DUTs 519, 520, 522, 523 performs the required tasks. The test results, with individual memory address locations for each memory die section, and data error log, can be recorded in the corresponding SCUs, and the aggregated logs can be provided to the MCU 505, and stored in the network 503 for further analysis. In this example the MCU 505 could program and test some sockets to test one type of volatile memory, and some sockets to test one type of non-volatile memory at nominal levels. In another example the same program can apply to the same volatile and non-volatile memory sockets but with voltage variation using PMU, or clock frequency variation using CMU, or temperature variation using TMU or a combination of one or more variation of PMU, CMU, and TMU to test the same volatile and non-volatile memory sockets with multiple corner testing.

One or more of the SCUs are intelligent. In some embodiments, for example, the SCUs are configured to run functional test pattern(s) while the DUTs are running host application(s). In some embodiments, the SCUs can even run some or all of host application(s) using memories of the DUTs.

Although certain preferred embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence.

Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. A memory testing system, comprising:
   a Master Controller Unit (MCU) configured to provide a test pattern to each of at least a first Slave Controller Unit (first SCU) and a second Slave Controller Unit (second SCU);
   wherein the first SCU is configured to use the test pattern to test at least first and second memories, concurrently with the second SCU using the test pattern to test at least third and fourth memories;
   wherein each of the first and second SCUs is configured to operate independently from each other and is configured to test both volatile and non-volatile memories;
   wherein the MCU or the first SCU is configured to change temperature, frequency and voltage of the first and second memories; and
   wherein the MCU or the second SCU is configured to change temperature, frequency and voltage of the third and fourth memories.

2. The memory testing system of claim 1, wherein the stand-alone configuration comprises a bare metal firmware (FW) operating system.

3. The memory testing system of claim 1, wherein the stand-alone configuration comprises a mini operating system, an embedded operating system, or real-time operating system (RTOS).

4. The memory testing system of claim 1, wherein at least the first SCU is configured to run a target customer application.

5. The memory testing system of claim 1, wherein at least the first SCU is configured to perform at least one of AC and DC memory testing.

6. The memory testing system of claim 1, wherein at least the first SCU is configured to test the memories against temperature parameters.

7. A method of concurrently testing memories of multiple Devices Under Test (DUTs), comprising:
   transferring a test protocol from a master control unit (MCU) to at least first and second slave control units (SCUs);
   utilizing operations of the first SCU to execute the test protocol against at least first and second DUTs while changing temperature. frequency and voltage of the first and second memories, concurrently with utilizing operations of the second SCU to execute the test protocol against at least third and fourth DUTs while changing temperature. frequency and voltage of the third and fourth memories; wherein each of the first and second SCUs is configured to operate independently from each other and is configured to test both volatile and non-volatile memories.

8. The method of claim 7, wherein the step of transferring comprises transferring the test protocol via a wireless network.

9. The method of claim 7, wherein the step of transferring comprises transferring the test protocol via a hard-wired connection.

10. The method of claim 7, further comprising using software running on a personal computer (PC) to execute the protocol against the first, second, third, and fourth ones of the memories.

11. The method of claim 7, further comprising using hardware running on an Application Specific Integrated Circuit (ASIC) to execute the protocol against the first, second, third, and fourth ones of the memories.

12. The method of claim 7, further comprising using hardware running on a Field Programmable Gate Array (FPGA) to execute the protocol against the first, second, third, and fourth ones of the memories.

13. The method of claim 7, further comprising at least the first SCU executing real-time testing on at least one of the memories during run-time of a customer application.

14. The method of claim 7, further comprising the MCU collecting the test results from at least the first SCU, and storing an aggregated error log for volatile ones of the memories.

15. The method of claim 7, further comprising the MCU collecting the test results from at least the first SCU, and storing an aggregated error log for non-volatile ones of the memories.

16. The method of claim 7, further comprising the MCU collecting the test results from at least the first SCU, and storing an aggregated error log in the first SCU.

17. The method of claim 7, further comprising the MCU collecting the test results from at least the first SCU, and storing an aggregated error log in a network outside of the first SCU.

18. The method of claim 7, further comprising the MCU accessing the test protocol via an intranet.

19. The method of claim 7, further comprising the MCU accessing the test protocol via an extranet.

20. The method of claim 7, wherein the test protocol is a customer memory testing pattern, and at least the first SCU is configured to run a target customer application using the customer memory testing pattern.

* * * * *